United States Patent
Kurosawa

(10) Patent No.: US 9,786,263 B2
(45) Date of Patent: Oct. 10, 2017

(54) ELECTRONIC APPARATUS AND NOISE REDUCTION METHOD

(71) Applicant: ALPINE ELECTRONICS, INC., Shinagawa-ku, Tokyo (JP)

(72) Inventor: Takeshi Kurosawa, Iwaki (JP)

(73) Assignee: Alpine Electronics, Inc., Tokyo (JP)

( * ) Notice: Subject to any disclaimer, the term of this patent is extended or adjusted under 35 U.S.C. 154(b) by 0 days.

(21) Appl. No.: 15/333,595

(22) Filed: Oct. 25, 2016

(65) Prior Publication Data

US 2017/0200443 A1 Jul. 13, 2017

(30) Foreign Application Priority Data

Jan. 13, 2016 (JP) .................................. 2016-004022

(51) Int. Cl.
*G10K 11/16* (2006.01)
*G10K 11/178* (2006.01)
*H03G 3/30* (2006.01)

(52) U.S. Cl.
CPC ......... *G10K 11/178* (2013.01); *H03G 3/3005* (2013.01); *G10K 11/1786* (2013.01); *G10K 11/1788* (2013.01); *G10K 2210/12821* (2013.01); *G10K 2210/3044* (2013.01)

(58) Field of Classification Search
CPC ... G10K 2210/1282; G10K 2210/1281; G10K 11/1788; G10K 11/1786; G10K 11/178

USPC .................................................. 381/86, 71.4
See application file for complete search history.

(56) References Cited

U.S. PATENT DOCUMENTS

| | | | |
|---|---|---|---|
| 9,245,519 B2* | 1/2016 | Klug | G10K 11/178 |
| 9,269,344 B2* | 2/2016 | Pan | G10K 11/178 |
| 2004/0042624 A1* | 3/2004 | Henderson | H03G 5/165 381/86 |
| 2015/0189438 A1* | 7/2015 | Hampiholi | G06F 3/165 381/80 |

FOREIGN PATENT DOCUMENTS

JP 2006-213297 8/2006

* cited by examiner

*Primary Examiner* — Disler Paul
(74) *Attorney, Agent, or Firm* — Brinks Gilson & Lione

(57) ABSTRACT

An electronic apparatus with a noise reduction function includes a microphone for inputting an external sound signal inside a vehicle, a DSP for generating a noise reduction signal in order to reduce noise of the external sound signal, a determination unit for determining a driving state of the vehicle, a correction unit for relatively increasing a degree of noise reduction when it is determined that the vehicle is in automatic driving and relatively decreasing a degree of noise reduction when it is determined that the vehicle is in manual driving, and a speaker for outputting the corrected noise reduction signal.

18 Claims, 11 Drawing Sheets

| DRIVING STATE | CORRECTION CONTENTS | |
|---|---|---|
| | FREQUENCY TO BE REDUCED | AMPLITUDE LEVEL |
| AUTOMATIC DRIVING | ALL BANDS | G = 1.0 |
| MANUAL DRIVING | ROAD NOISE | G = 0.5 |

| DRIVING STATE | CORRECTION CONTENTS ||
| | FREQUENCY TO BE REDUCED | AMPLITUDE LEVEL |
|---|---|---|
| AUTOMATIC DRIVING | ALL BANDS | G = 1.0 |
| MANUAL DRIVING | ROAD NOISE | G = 0.5 |

FIG. 5

NOISE INFORMATION

| NOISE TYPE | ENGINE SPEED | | | SPEED | | |
|---|---|---|---|---|---|---|
| | UP TO N1 | N1 TO N2 | N2 TO N3 | UP TO P1 | P1 TO P2 | P2 TO P3 |
| ROAD NOISE | f1 | f2 | f3 | f1' | f2' | f3' |
| ENGINE NOISE | ... | ... | ... | ... | ... | ... |
| WIND NOISE | ... | ... | ... | ... | ... | ... |

*FIG. 7*

| PREPARATION PERIOD FOR MANUAL DRIVING | CORRECTION CONTENTS | | |
|---|---|---|---|
| | FREQUENCY TO BE REDUCED | AMPLITUDE LEVEL | NOISE AMPLIFICATION |
| PERIOD 1 | ALL BANDS | G=0.3 | NO |
| PERIOD 2 | NO | G=0 | YES |
| PERIOD 3 (MANUAL) | ROAD NOISE | G=0.5 | NO |

FIG. 12

| DRIVING STATE | CORRECTION CONTENTS |
|---|---|
| AUTOMATIC DRIVING | PERFORM NOISE REDUCTION IN ALL SEATS |
| MANUAL DRIVING | PERFORM NOISE REDUCTION IN SEATS WHERE PASSENGERS SIT |

ELECTRONIC APPARATUS AND NOISE REDUCTION METHOD

RELATED APPLICATION

The present application claims priority to Japanese Patent Application Number 2016-004022, filed Jan. 13, 2016, the entirety of which is hereby incorporated by reference.

BACKGROUND

1. Field of the Disclosure

The present disclosure relates to a noise reduction method for reducing noise such as road noise inside a vehicle, and particularly to noise reduction control depending on a driving situation such as automatic driving or manual driving.

2. Description of the Related Art

When a person listens to music via CD, DVD or radio broadcasting in a vehicle, he/she is exposed to noise such as engine noise or road noise and cannot listen to music well. In order to address the situation, a noise cancel system for removing or reducing noise is provided in the vehicle. With the noise cancel system, a microphone is installed inside a vehicle, noise is extracted from external sound via the microphone, and a noise cancel signal for canceling noise from the extracted noise is generated and is output together with an audio signal.

JP 2006-213297 A discloses an active noise vibration control apparatus for preventing a reduction in vibration in a specific frequency band. JP 2006-213297 A describes a method for preventing a reduction in sound which may be comfortable for the passengers, such as engine sound or exhaust sound.

Advanced image processing techniques, communication techniques, high-accuracy vehicle location calculation techniques, and the like are enhanced and are being studied and developed for practical use in automatic driving. Further, to control automatic diving at some levels is being discussed depending on factors such as vehicle-mounted functions, road types, or traveling environments. According to the control, complete automatic driving is performed in one zone during traveling, while semi-automatic driving or manual driving is performed in another zone.

When the driving is switched to complete automatic driving, semi-automatic driving, or manual driving, it is desired to realize a noise reduction function depending on the driving situation. For example, it is desired to strongly apply the noise cancel function to provide a quiet space inside the vehicle during complete automatic driving, while it is desired to weakly apply the noise cancel function to enable the driver to listen to external sound such as engine sound or exhaust sound during manual driving.

SUMMARY

It is an object of the present disclosure to solve the conventional problems and to provide an electronic apparatus capable of controlling a noise reduction function depending on a driving state and a noise reduction method.

An electronic apparatus with a noise reduction function according to the present disclosure includes: an input unit configured to input an external sound signal inside a vehicle; a generation unit configured to generate a noise reduction signal in order to reduce noise of the external sound signal; a determination unit configured to determine a driving state of the vehicle; a correction unit configured to correct the noise reduction signal in order to correct a degree of noise reduction based on a determination result of the determination unit; and an output unit configured to output the noise reduction signal corrected by the correction unit.

It is preferable that the determination unit determines whether the vehicle is in automatic driving and if the determination unit determines that the vehicle is in automatic driving, the correction unit corrects the noise reduction signal at a first degree as a relatively high degree of noise reduction. It is preferable that, when the determination unit determines that the vehicle is not in automatic driving, the correction unit corrects the noise reduction signal at a second degree as a relatively low degree of noise reduction. It is preferable that the correction unit selects a frequency band of a noise reduction signal to be generated. It is preferable that the correction unit corrects an amplitude level of the noise reduction signal. It is preferable that the electronic apparatus further includes: a storage unit configured to store noise information on noise frequencies corresponding to traveling states of the vehicle, wherein the correction unit corrects the noise reduction signal based on the noise information. It is preferable that the correction unit corrects the noise reduction signal depending on an engine speed or vehicle speed. It is preferable that the determination unit further determines a preparation stage for manual driving, and the correction unit corrects the noise reduction signal at a third degree as a low degree of noise reduction in the preparation stage for manual driving. It is preferable that, when noise reduction is not performed at the third degree, the output unit outputs the external sound signal input from the input unit. It is preferable that the output unit further includes an amplification unit configured to amplify the external sound signal. It is preferable that the electronic apparatus further includes: a reproduction unit configured to reproduce a multimedia signal, wherein the output unit outputs a multimedia signal reproduced by the reproduction unit. It is preferable that the determination unit further determines whether the reproduction unit is reproducing a multimedia signal, and when it is determined that a multimedia signal is being reproduced, the correction unit corrects the noise reduction signal to increase a degree of noise reduction, and when it is determined that a multimedia signal is not being reproduced, the correction unit corrects the noise reduction signal depending on a driving state of the vehicle. It is preferable that the electronic apparatus further includes: seat sensors, wherein the correction unit corrects the noise reduction signal per seat based on detection results of the seat sensors. It is preferable that, when it is determined that the vehicle is in automatic driving, the correction unit corrects the noise reduction signal to increase the degree of noise reduction in all the seats, and when it is determined that the vehicle is in manual driving, the correction unit corrects the noise reduction signal to increase the degree of noise reduction in seats where passengers sit. It is preferable that the output unit includes speakers corresponding to the seats.

A noise reduction method according to the present disclosure is a noise reduction method in an electronic apparatus including an input unit configured to input an external sound signal inside a vehicle, a sound output unit configured to output sound into the vehicle, and a control unit, and the method includes: inputting the external sound signal; determining a driving state of the vehicle; correcting a noise reduction signal depending on the determined driving state in order to reduce noise of the external sound signal; and outputting the corrected noise reduction signal from the output unit.

According to the present invention, a degree of noise reduction is changed depending on a driving state of a vehicle, thereby providing the vehicle with an acoustic space depending on a driving state.

BRIEF DESCRIPTION OF THE DRAWINGS

FIG. 5 illustrates exemplary noise information indicating a relationship between frequency and engine speed or vehicle speed depending on a noise type according to the first exemplary embodiment;

FIG. 7 is a table for explaining correction contents of noise reduction during a manual driving preparation period according to a second exemplary embodiment;

FIG. 12 is a table for explaining correction contents of noise reduction during a manual driving preparation period according to the fourth exemplary embodiment.

DETAILED DESCRIPTION

Exemplary embodiments of the present invention will be described below. According to the preferred exemplary embodiments of the present invention, there is provided a noise reduction function of reducing or removing noise such as road noise, engine noise, and wind noise inside a vehicle. According to the preferred exemplary embodiments of the present invention, an electronic apparatus with the noise reduction function is mounted inside a vehicle. The electronic apparatus may be an audio/video reproduction apparatus, a navigation apparatus, an apparatus with a function of receiving TV broadcasting/radio broadcasting, or a vehicle-mounted apparatus or computer apparatus with other functions. Generally, a noise reduction method may be a method in which one or more microphones are installed inside a vehicle, external sound including noise is input from the microphones, a noise signal is extracted from the external sound, and a cancel signal for compensating for the noise is output from a speaker. The cancel signal output from the speaker has a reverse phase to the noise signal. For example, the noise signal is extracted by use of an adaptive filter or the like, and the computation processing is performed by a digital signal processor (DSP) or the like. Another noise reduction method is to predict noise based on an engine speed or vehicle speed and to output a cancel signal for compensating for the predicted noise from a speaker. In this method, the noise frequency information or the like corresponding to the engine speed or vehicle speed is previously stored in a memory, and the information is referred to, thereby predicting noise and generating a cancel signal. The present invention can employ either of the noise reduction methods.

Exemplary Embodiments

Figure 1:
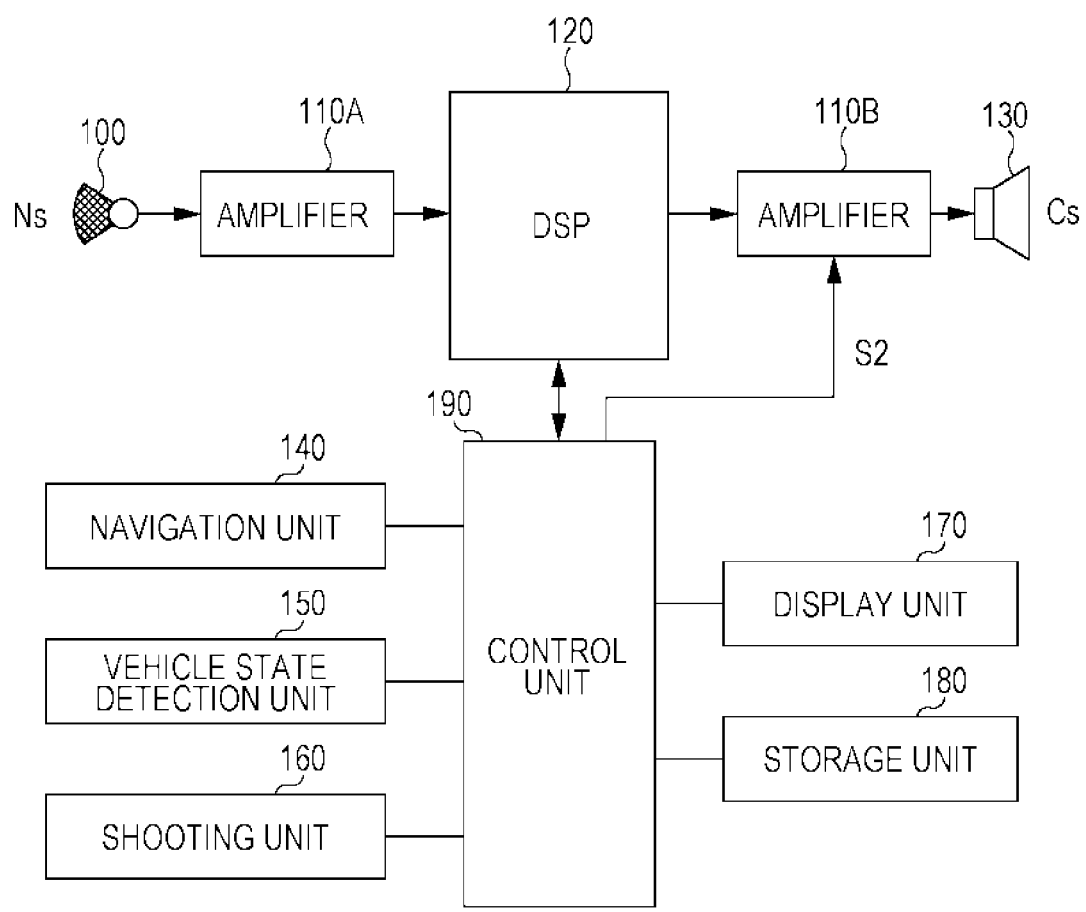
FIG. 1 is a block diagram illustrating a configuration of an electronic apparatus with a noise reduction function according to a first exemplary embodiment of the present invention.

FIG. 1 is a block diagram illustrating an exemplary configuration of an electronic apparatus with a noise reduction function according to a first exemplary embodiment of the present invention. An electronic apparatus 10 includes a microphone 100, amplifiers 110A and 110B, a DSP (signal processing unit) 120, a speaker 130, a navigation unit 140, a vehicle state detection unit 150, a shooting unit 160, a display unit 170, a storage unit 180, and a control unit 190.

One or more microphones 100 are installed inside a vehicle, for example, thereby to input external sound including noise inside the vehicle. The noise included in the external sound is engine noise, road noise, wind noise, and the like. If music is being output from the speaker 130, the microphones 100 input external sound including both the music and the noise. There will be described an example in which music is not being reproduced and noise is input as external sound from the microphones 100 according to the first exemplary embodiment.

Figure 2:
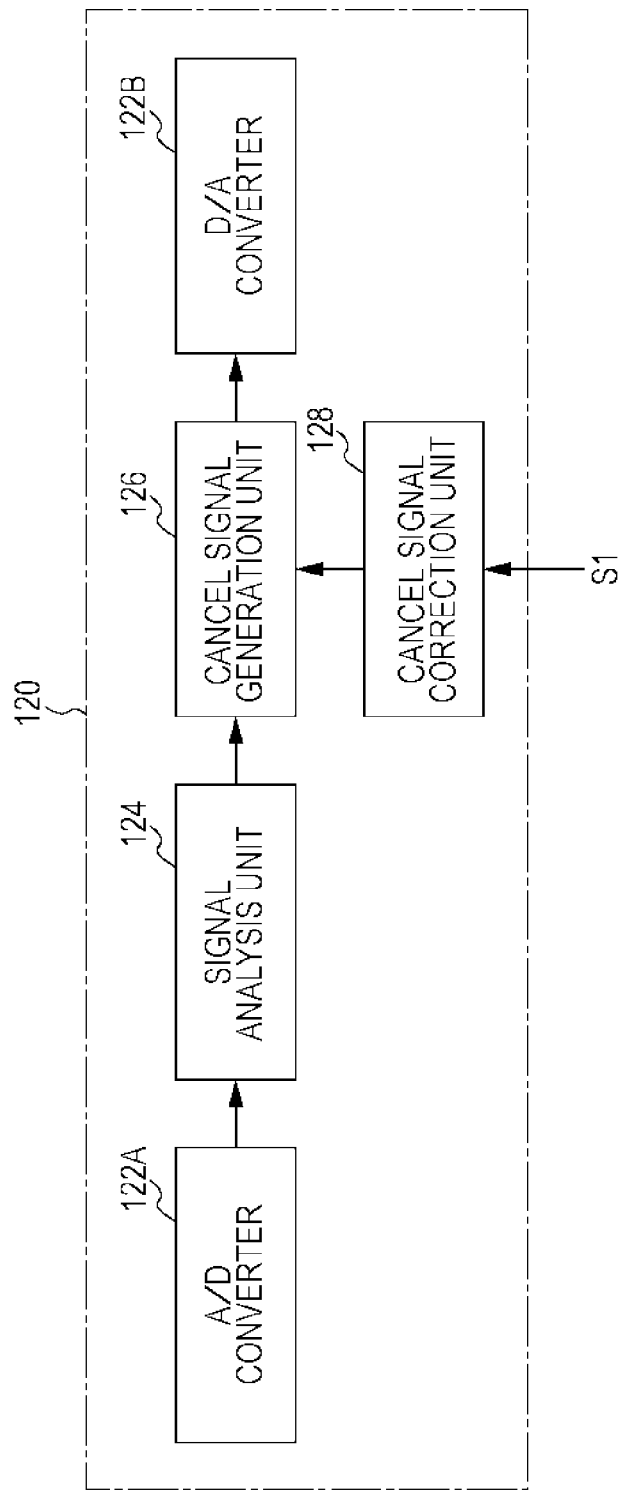
FIG. 2 is a diagram illustrating a configuration of the noise reduction function in a DSP illustrated in FIG. 1 by way of example.

Noise Ns input from the microphone 100 is converted into an electric signal, and the electric signal is amplified by the amplifier 110A and input into the DSP 120. The DSP 120 converts the noise signal Ns into a digital signal and generates a cancel signal Cs for canceling the noise signal Ns. FIG. 2 is a diagram illustrating an exemplary configuration of the noise reduction function of the DSP 120. The DSP 120 includes an A/D converter 122A for converting an analog signal into a digital signal, a D/A converter 122B for converting a digital signal into an analog signal, a signal analysis unit 124, a cancel signal generation unit 126, and a cancel signal correction unit 128.

The A/D converter 122A converts the noise signal Ns output from the amplifier 110A into a digital signal. The signal analysis unit 124 receives the digitally-converted noise signal Ns, and analyzes the frequency characteristics, amplitude level and the like of the noise signal Ns. The analysis result is provided to the cancel signal generation unit 126. The cancel signal generation unit 126 generates a cancel signal having a reverse phase to the noise signal Ns based on the analysis result of the signal analysis unit 124. The D/A converter 122B converts the generated cancel signal into an analog sound signal, and the cancel sound signal Cs is output from the speaker 130 into the vehicle via the amplifier 110B.

The cancel signal correction unit 128 corrects the cancel signal based on a control signal S1 from the control unit 190. The cancel signal is corrected thereby to achieve the noise reduction function depending on a driving situation or driving state. Specifically, the cancel signal correction unit 128 corrects a frequency of the cancel signal generated by the cancel signal generation unit 126 or corrects an amplitude of the cancel signal generated by the cancel signal generation unit 126. The former correction of a frequency of the cancel signal enables only the noise of a specific frequency to be reduced, and enables to selectively reduce or remove noise in order to prevent a reduction in noise in other frequencies. Further, the latter correction of an amplitude of the cancel signal causes a cancel signal at the same amplitude level as the amplitude level of the noise signal to be generated or causes a cancel signal at a lower amplitude level than the amplitude level of the noise signal to be generated, thereby changing a degree of cancellation of the noise signal by the cancel signal.

The navigation unit 140 calculates a current location of the vehicle, calculates a route to the destination, or displays a road map around the vehicle location on the display unit 170 based on a GPS signal transmitted from the GPS satellite or the detection result of a gyro sensor or acceleration sensor mounted on the vehicle. Further, the function of the navigation unit 140 can be used also for automatic driving. Automatic driving is directed to automatically control traveling speed, steering, inter-vehicular distance, traveling lane, braking, and the like, and very precise and accurate information is essential for such control. For example, when the road map data used by the navigation unit 140 includes very detailed lane information and the like, the lane information can be used for automatic driving. Further, when the vehicle location detection using the GPS satellite is very accurate, the detection result can be used for automatic driving. Furthermore, information on whether the vehicle is traveling on a specific road such as an expressway or tollway can be used for automatic driving.

The vehicle state detection unit 150 detects a state of the vehicle. For example, speed, gear position, engine speed, steering angle, turn signal, auto-cruising function ON/OFF information, output information of passenger seat sensor, and the like are detected via a vehicle bus. Further, the vehicle state detection unit 150 may detect information on whether the vehicle is in automatic driving. The information on automatic driving may be acquired via the vehicle bus, or information indicated via user input may be acquired therefor when the user input (such as input button or touch input) for instructing to switch automatic driving and manual driving is provided.

The shooting unit 160 includes an interior camera for shooting the inside of the vehicle and an exterior camera for shooting the outside of the vehicle. The interior camera shoots the driver and passengers, and the exterior camera shoots the surroundings of the vehicle by a front view camera, rear view camera, side view camera, or the like. The image data shot by the shooting camera 160 is provided to the control unit 190 to be used for determining a vehicle state.

The storage unit 180 can store various items of data, software, and the like. For example, the map data used by the navigation unit 140 is stored therein. The map data includes link data indicating the road sections, and the link data on the sections where automatic driving is possible may be set with a flag. When the navigation unit 140 is associated with automatic driving, the flag information or the like is referred to in order to determine whether the vehicle is currently in automatic driving.

The control unit 190 is configured of a microcontroller or the like including ROM, RAM, and the like according to the preferred exemplary embodiments, and the ROM or the RAM can store therein various programs for controlling the operation of each unit in the electronic apparatus 10.

According to the first exemplary embodiment, the control unit 190 executes a noise reduction program 200 for controlling the noise reduction function depending on a driving state.

Figures 3, 4:
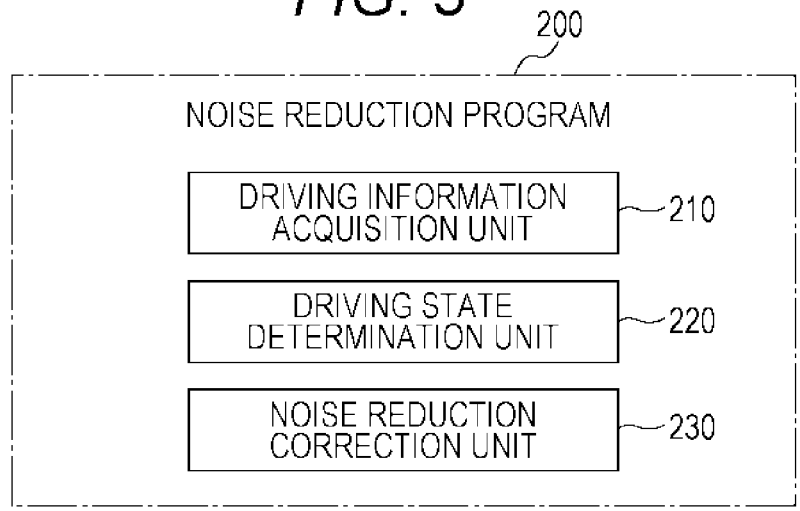
FIG. 3 is a diagram illustrating an exemplary functional configuration of a noise reduction program according to the first exemplary embodiment.
FIG. 4 is a diagram illustrating a relationship between a determination result by a driving determination unit and correction of noise reduction according to the first exemplary embodiment.

FIG. 3 is a diagram illustrating an exemplary functional configuration of the noise reduction program 200. The noise reduction program 200 includes a driving information acquisition unit 210, a driving state determination unit 220, and a noise reduction correction unit 230.

The driving information acquisition unit 210 acquires the driving information on the driving from the navigation unit 140, the vehicle state detection unit 150, the shooting unit 160, and the like. The driving state determination unit 220 determines whether the vehicle is in the automatic driving state based on the driving information acquired by the driving information acquisition unit 210. When the driving information acquired by the driving information acquisition unit 210 includes the information on whether the vehicle is in automatic driving or manual driving, the information is followed, but when the information is not included, a determination is made as to whether the vehicle is in automatic driving based on the acquired driving information. For example, a determination may be made as to whether the vehicle is in automatic driving based on whether the road on which the vehicle is traveling is set with a flag as a road for automatic driving, whether the auto-cruising function is ON, whether the driver shot by the shooting unit 160 is not performing the driving operation, or the like.

The noise reduction correction unit 230 determines a degree of noise reduction based on the determination result of the driving state determination unit 220, and outputs the control signal S1 depending on the determination to the cancel signal correction unit 128. Specifically, the noise reduction correction unit 230 corrects a degree of noise reduction depending on whether the vehicle is in automatic driving or manual driving. A noise reduction degree correction method is to select noise to be reduced and/or to correct an amplitude of a cancel signal. FIG. 4 illustrates exemplary correction contents of the noise reduction correction unit 230. When it is determined that the vehicle is in automatic driving, the noise reduction correction unit 230 makes a correction to reduce noise in all the bands, and when it is determined that the vehicle is in manual driving, the noise reduction correction unit 230 makes a correction to reduce only road noise, for example. The correction contents of FIG. 4 may be arbitrarily set, and engine noise may be reduced during manual driving, for example. According to the preferred exemplary embodiments, as illustrated in FIG. 5, noise information in the frequencies of noise corresponding to engine speed or vehicle speed is previously stored in the storage unit 180. The noise reduction correction unit 230 selects a frequency to be subjected to noise reduction depending on an engine speed or vehicle speed with reference to the noise information. For example, when road noise is to be reduced, a frequency band of the road noise is selected by either the engine speed or the vehicle speed, or the averages of both.

Further, the noise reduction correction unit 230 can correct an amplitude of the cancel signal as illustrated in FIG. 4. For example, when it is determined that the vehicle is in automatic driving, the noise reduction correction unit 230 assumes gain G=1 at the amplitude level, and when it is determined that the vehicle is in manual driving, the noise reduction correction unit 230 sets gain G=0.5 at the amplitude level. At gain G=1, the amplitude level of the cancel signal takes almost the same value as the amplitude level of the noise signal. At gain G=0.5, the amplitude level is around half, and thus the road noise reduction function is weakened. When gain G=0 is set, the amplitude takes 0, and noise is not reduced in effect. The correction illustrated in FIG. 4 is exemplary, and a combination of selection of a frequency to be reduced and correction of an amplitude level can be arbitrarily set. Further, the noise reduction correction unit 230 may either select noise or correct an amplitude level, or may set the gains at different amplitude levels when a plurality of noises (such as road noise and wind noise) to be selected are present.

Figure 6:
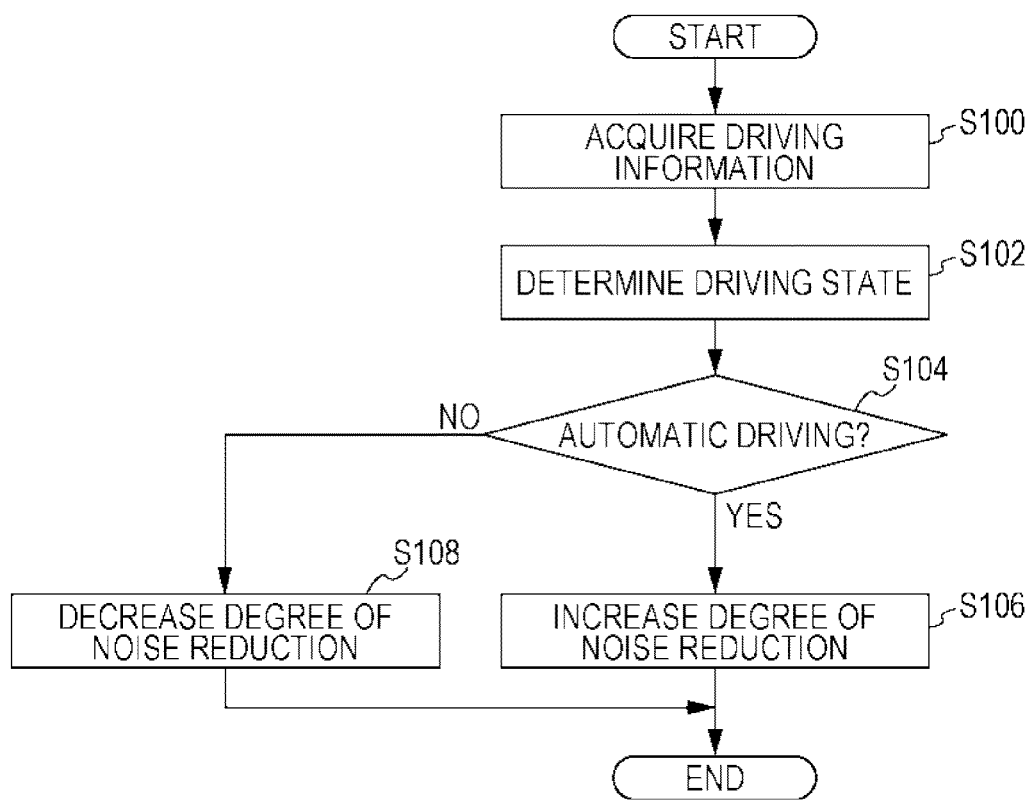
FIG. 6 is a flowchart for explaining a noise reduction operation of the electronic apparatus according to the first exemplary embodiment.

The noise reduction operation in the electronic apparatus according to the present exemplary embodiment will be described below with reference to the flowchart of FIG. 6. At first, the driving information acquisition unit 210 acquires driving information (S100), and then the driving determination unit 220 determines whether the vehicle is in automatic driving or manual driving based on the acquired driving information (S102). When it is determined that the vehicle is in automatic driving (S104), the noise reduction correction unit 230 generates a noise cancel signal in all the bands as illustrated in FIG. 4, and outputs the control signal S to the cancel signal correction unit 128 to assume gain G=1 at the amplitude level, thereby relatively increasing a degree of noise reduction (S106), for example. Consequently, noise is reduced from the inside of the vehicle to provide the quiet space.

On the other hand, when it is determined that the vehicle is in manual driving (S104), the noise reduction correction unit 230 reduces road noise as illustrated in FIG. 4, and outputs the control signal S to the cancel signal correction unit 128 to assume gain G=0.5 at the amplitude level, thereby relatively decreasing a degree of noise reduction (S108), for example. Consequently, the driver can hear engine noise and relatively-small road noise.

As described above, according to the first exemplary embodiment, a degree of noise reduction can be changed depending on whether the vehicle is in automatic driving or manual driving. In many cases, it is assumed that a degree of noise reduction is increased during automatic driving and a degree of noise reduction is decreased during manual driving, and a quiet environment is caused inside the vehicle by the noise reduction function and an environment where external sound is audible can be caused inside the vehicle during manual driving.

The first exemplary embodiment is that the driving state determination unit 220 determines whether the vehicle is in automatic driving or manual driving, and performs noise reduction depending on the determination result, but when the driving state determination unit 220 can determine whether the vehicle is in semi-automatic driving, the noise reduction correction unit 230 can perform noise reduction depending on semi-automatic driving. For example, if it is determined that the vehicle is in semi-automatic driving, the driver performs part of the driving operation, and thus it is desirable that the vehicle is under the environment where some external sound can be more audible than in complete automatic driving. Therefore, gain G at which noise is reduced in all the bands and the amplitude levels are slightly reduced may be set, for example.

A second exemplary embodiment of the present invention will be described below. When automatic driving is switched to manual driving, the driver needs a preparation period for manual driving. According to the second exemplary embodiment, when the driver is prompted to perform manual driving, noise is directly reproduced or amplified in the preparation stage.

According to the second exemplary embodiment, the driving state determination unit 220 determines a timing to prompt the driver to perform manual driving. For example, the driving state determination unit 220 determines a timing when the road on which the vehicle is traveling changes from the road for automatic driving (such as a freeway) to a road not for automatic driving (a local road) with reference to the link data of the road map. Alternatively, when the routes for automatic driving are discriminated from the routes for manual driving in the routes searched by the navigation unit, the driving state determination unit 220 determines a timing at a border therebetween.

When the driving state determination unit 220 determines a timing to prompt manual driving, the noise reduction correction unit 230 makes noise correction such that the driver can hear eternal noise until the driving is switched to manual driving. FIG. 7 illustrates exemplary correction by the noise reduction correction unit 230. When it is determined that the vehicle is in the manual driving preparation period, a period until manual driving is divided into period 1, period 2, and period 3, for example. The period 3 matches with the correction contents during manual driving illustrated in FIG. 4. The noise reduction correction unit 230 first assumes the frequencies to be subjected to noise reduction in all the bands in the period 1, but causes an environment where noise (external sound) is a little more audible inside the vehicle at gain G=0.3 at the amplitude level than in automatic driving.

Then, gain G=0 at the amplitude level is assumed in the period 2. This indicates that the amplitude of the cancel signal is "0." Therefore, there is consequently no frequency to be reduced. In this case, the cancel signal generation unit 126 does not invert the phase of the input noise signal, and outputs the noise signal as it is. Thereby, noise is directly reproduced from the speaker 130. Further, the noise reduction correction unit 230 may output a control signal S2 to the amplifier 110B, and may amplify the noise signal output from the DSP 120. Thereby, an environment where relatively large noise is audible is caused inside the vehicle, and the driver can know of the preparation for manual driving. In the next period 3, the noise reduction correction unit 230 outputs the control signal S1 to the cancel signal correction unit 128 to achieve the correction contents in manual driving illustrated in FIG. 4.

Figure 8:
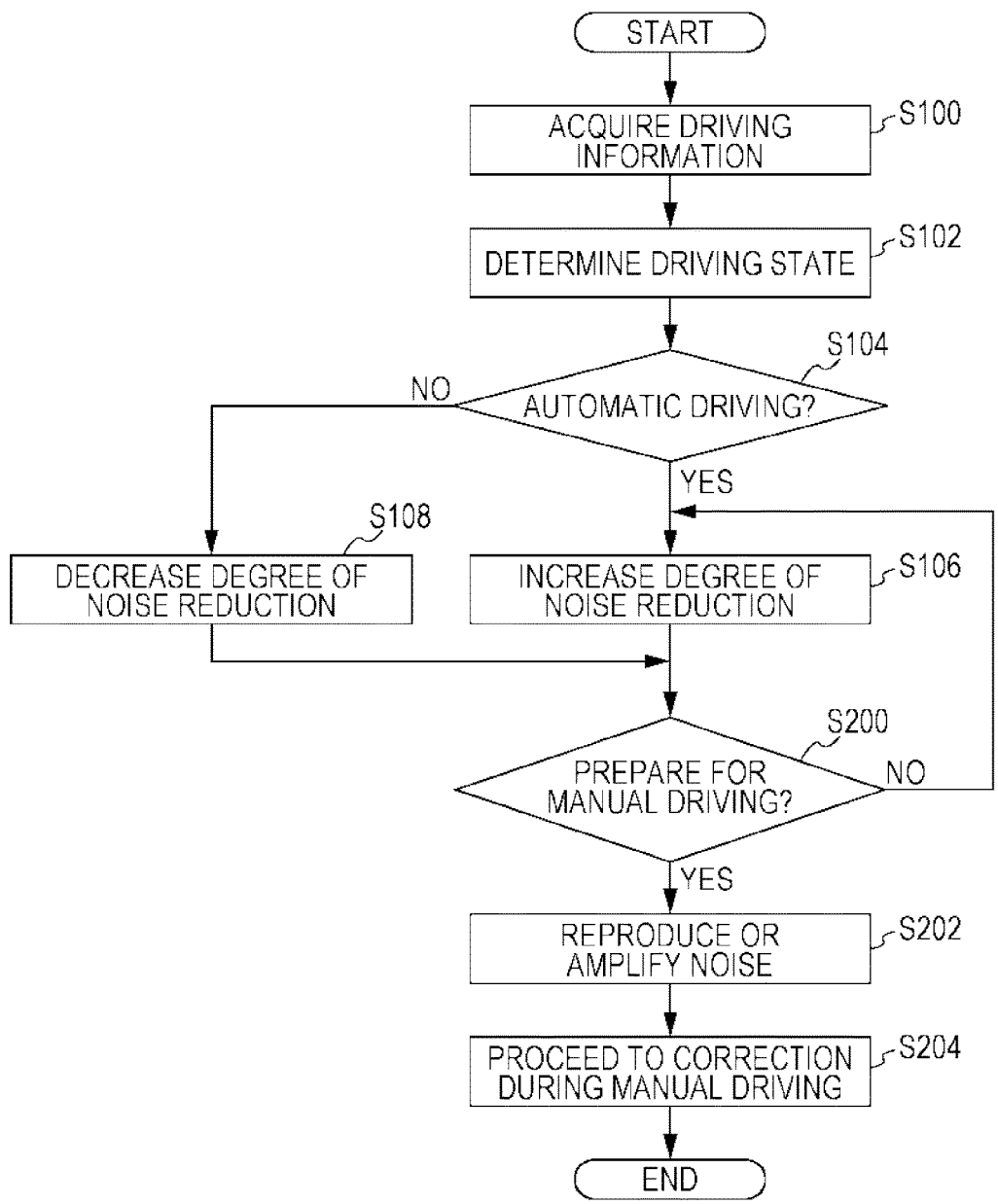
FIG. 8 is a flowchart for explaining a noise reduction operation of an electronic apparatus according to a second exemplary embodiment.

FIG. 8 is a flowchart illustrating the operation of the second exemplary embodiment. Steps S100 to S106 are the same as in the first exemplary embodiment. According to the second exemplary embodiment, when the driving state determination unit 220 determines a timing to prompt the preparation for manual driving (S200) while determining that the vehicle is in automatic driving, the noise reduction correction unit 230 makes the correction as illustrated in FIG. 7 thereby to reproduce or amplify the noise (S202). Thereafter, when the driving state determination unit 220 determines that the vehicle is in manual driving, noise reduction correction is made during manual driving (S204).

According to the second exemplary embodiment, noise is directly reproduced or amplified during the preparation period for switching to manual driving, and the switch to manual driving can be notified to the driver. Thereby, the driver can easily start preparing for manual driving.

The noise reduction correction contents illustrated in FIG. 7 are exemplary, and it is not essential to divide a preparation period into a plurality of periods, for example. Correction may be made such that substantially-larger noise than in automatic driving is output into the vehicle during the manual driving preparation period. Further, noise may be directly reproduced or amplified by assuming the amplitude gain G=0 by the cancel signal generation unit 126 and directly inputting the noise signal input from the microphone 100 into the amplifier 110B and outputting it therefrom, for example.

Figure 9:
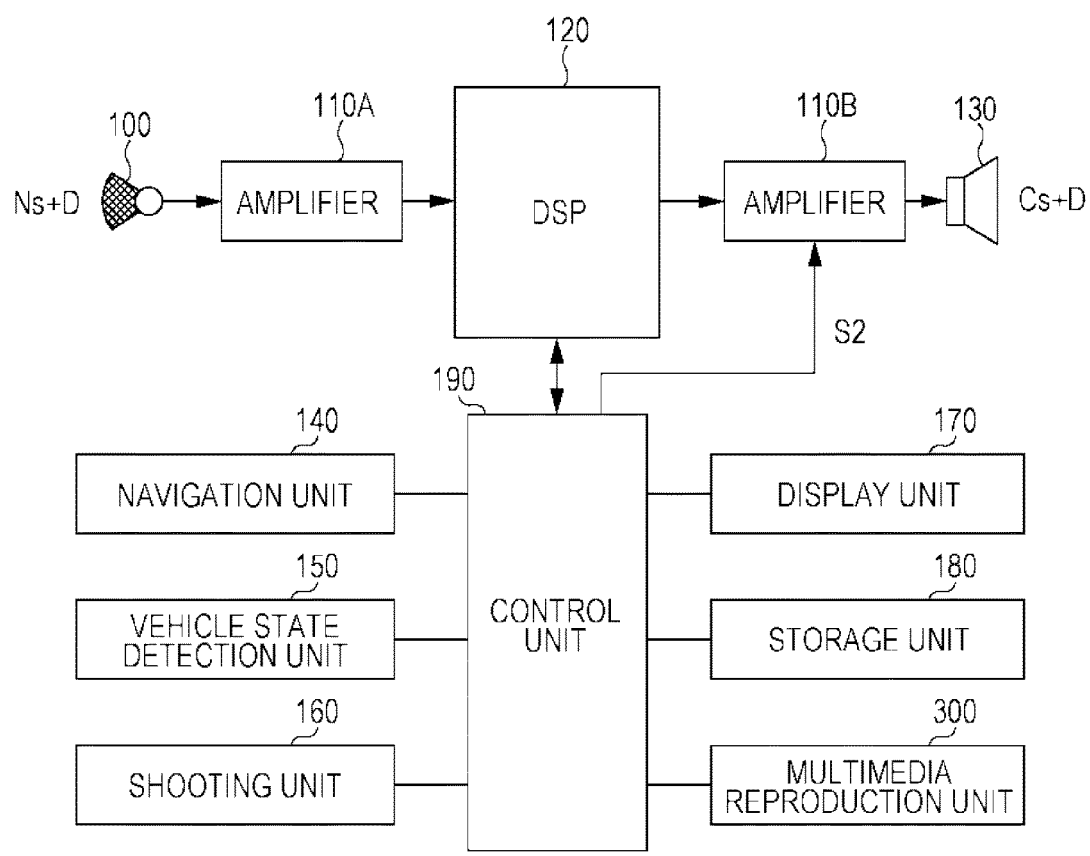
FIG. 9 is a block diagram illustrating a configuration of an electronic apparatus with a noise reduction function according to a third exemplary embodiment of the present invention.

A third exemplary embodiment of the present invention will be described below. FIG. 9 is a block diagram illustrating a configuration of an electronic apparatus 10A according to the third exemplary embodiment. According to the third exemplary embodiment, a multimedia reproduction unit 300 is provided. The multimedia reproduction unit 300 reproduces audio data, video data, or the like recorded in a recording medium such as DVD, CD or Blu-ray disc, and the reproduced audio signal is output from the speaker 130 and the reproduced video signal is displayed on the display unit 170.

When an audio signal D is being reproduced by the multimedia reproduction unit 300, external sound input from the microphone 100 includes the reproduced audio signal D and noise Ns. The signal analysis unit 124 in the DSP 120 inputs the audio signal D reproduced by the multimedia reproduction unit 300 and corrected by a transfer function, and an external signal D+Ns, extracts the noise signal Ns therefrom, and provides the noise signal Ns to the cancel signal generation unit 126.

Figure 10:
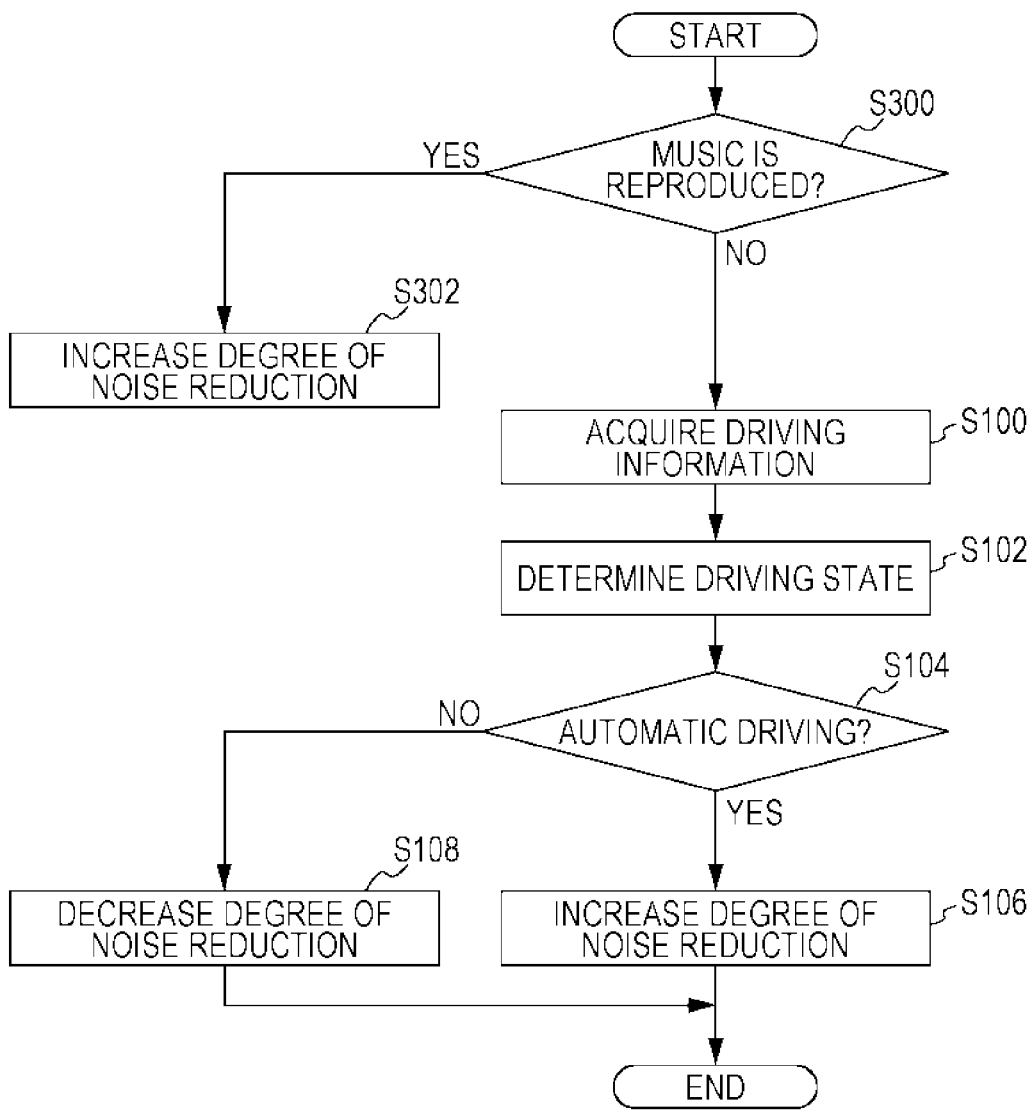
FIG. 10 is a flowchart for explaining a noise reduction operation of the electronic apparatus according to the third exemplary embodiment.

According to the third exemplary embodiment, when multimedia is being reproduced by the multimedia reproduction unit 300, for example, the noise reduction correction unit 230 may increase a degree of noise reduction thereby to create an environment where music is easily listened to inside the vehicle irrespective of whether the vehicle is in automatic driving or manual driving. FIG. 10 illustrates a flow of a noise reduction operation according to the third exemplary embodiment. According to the third exemplary embodiment, at first, the driving state determination unit 220 determines whether the multimedia reproduction unit 300 is reproducing multimedia (S300), and when multimedia is not being reproduced, the flow of steps S100 to S108 is performed similarly as in the first and second exemplary embodiments. On the other hand, when it is determined that multimedia is being reproduced, correction is made to increase a degree of noise reduction similarly to the noise reduction during automatic driving (S302).

As described above, according to the third exemplary embodiment, when music or the like is being reproduced, the noise reduction function is enhanced thereby to give priority to the environment where music can be easily listened to inside the vehicle, and when music or the like is not being reproduced, noise reduction is performed depending on automatic driving or manual driving.

Figure 11:
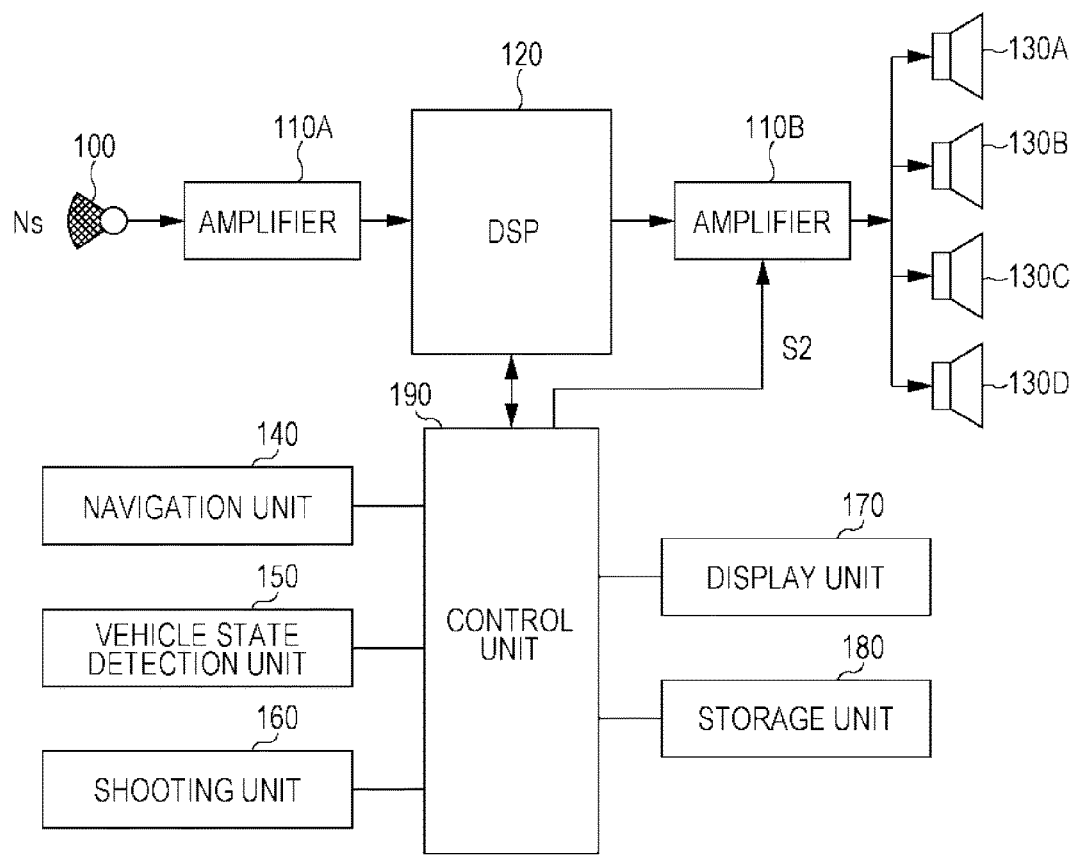
FIG. 11 is a block diagram illustrating a configuration of an electronic apparatus with a noise reduction function according to a fourth exemplary embodiment of the present invention.

A fourth exemplary embodiment of the present invention will be described below. FIG. 11 is a block diagram illustrating a configuration of an electronic apparatus 10B according to the fourth exemplary embodiment. The electronic apparatus 10B according to the fourth exemplary embodiment is provided with seat sensors and the speakers 130A, 130B, 130C, 130D at the driver seat, the front passenger seat, and the right and left rear passenger seats, respectively. The seat sensor detects the present of a passenger at each seat, and the detection result is provided to the driving state determination unit 220 via the driving information acquisition unit 210, and the driving state determination unit 220 performs noise reduction per sear based on the detection results of the seat sensors. Further, the DSP 120 has a plurality of channels, and a speech signal of each channel corresponds to the speaker 130A, 130B, 130C, or 130D, respectively. The cancel signal generation unit 126 generates a cancel signal per channel, and the cancel signal correction unit 128 controls the cancel signal generation unit 126 based on the control signal S1 from the noise reduction correction unit 230, thereby to perform noise reduction per seat.

FIG. 12 is a table illustrating exemplary correction contents of noise reduction according to the fourth exemplary embodiment. In the example, when the driving state determination unit 220 determines that the vehicle is in automatic driving, the noise reduction correction unit 230 controls the cancel signal correction unit 128 to reduce noise in all the seats irrespective of the detection results of the seat sensors, and when the driving state determination unit 220 determines that the vehicle is in manual driving, the noise reduction correction unit 230 controls the cancel signal correction unit 128 to reduce noise at the seats where the passengers sit. A degree of noise reduction at this time may be the correction as illustrated in FIG. 4 or the correction for increasing a degree of noise reduction in both automatic driving and manual driving. Under such control, a quiet environment is always provided inside the vehicle during automatic driving, and a quiet space can be provided only to the seats where the passengers sit during manual driving.

While there has been illustrated and described what is at present contemplated to be preferred embodiments of the present invention, it will be understood by those skilled in the art that various changes and modifications may be made, and equivalents may be substituted for elements thereof without departing from the true scope of the invention. In addition, many modifications may be made to adapt a particular situation to the teachings of the invention without departing from the central scope thereof. Therefore, it is intended that this invention not be limited to the particular embodiments disclosed, but that the invention will include all embodiments falling within the scope of the appended claims.

What is claimed is:

1. An electronic apparatus with a noise reduction function, comprising:
   an input unit configured to input an external sound signal inside a vehicle;
   a generation unit configured to generate a noise reduction signal in order to reduce noise of the external sound signal;
   a determination unit configured to determine a driving state of the vehicle, wherein the driving state includes whether the vehicle is under the control of automatic driving or manual driving;
   a correction unit configured to correct the noise reduction signal in order to correct a degree of noise reduction based on a determination result of the determination unit; and
   an output unit configured to output the noise reduction signal corrected by the correction unit.

2. The electronic apparatus according to claim 1,
   wherein the determination unit determines whether the vehicle is in automatic driving and if the determination unit determines that the vehicle is in automatic driving, the correction unit corrects the noise reduction signal at a first degree as a relatively high degree of noise reduction.

3. The electronic apparatus according to claim 1,
   wherein when the determination unit determines that the vehicle is not in automatic driving, the correction unit corrects the noise reduction signal at a second degree as a relatively low degree of noise reduction.

4. The electronic apparatus according to claim 1,
wherein the correction unit selects a frequency band of a noise reduction signal to be generated.

5. The electronic apparatus according to claim 1,
wherein the correction unit corrects an amplitude level of the noise reduction signal.

6. The electronic apparatus according to claim 1, further comprising:
a storage unit configured to store noise information on noise frequencies corresponding to traveling states of the vehicle,
wherein the correction unit corrects the noise reduction signal based on the noise information.

7. The electronic apparatus according to claim 1,
wherein the correction unit corrects the noise reduction signal depending on an engine speed or vehicle speed.

8. The electronic apparatus according to claim 1,
wherein the determination unit further determines a preparation stage for manual driving, and the correction unit corrects the noise reduction signal at a third degree as a low degree of noise reduction in the preparation stage for manual driving.

9. The electronic apparatus according to claim 8,
wherein when noise reduction is not performed at the third degree, the output unit outputs the external sound signal input from the input unit.

10. The electronic apparatus according to claim 9,
wherein the output unit further includes an amplification unit configured to amplify the external sound signal.

11. The electronic apparatus according to claim 1, further comprising:
a reproduction unit configured to reproduce a multimedia signal,
wherein the output unit outputs a multimedia signal reproduced by the reproduction unit.

12. The electronic apparatus according to claim 11,
wherein the determination unit further determines whether the reproduction unit is reproducing a multimedia signal, and
wherein, when it is determined that a multimedia signal is being reproduced, the correction unit corrects the noise reduction signal to increase a degree of noise reduction, and when it is determined that a multimedia signal is not being reproduced, the correction unit corrects the noise reduction signal depending on a driving state of the vehicle.

13. The electronic apparatus according to claim 1, further comprising:
seat sensors,
wherein the correction unit corrects the noise reduction signal per seat based on detection results of the seat sensors.

14. The electronic apparatus according to claim 13,
wherein when it is determined that the vehicle is in automatic driving, the correction unit corrects the noise reduction signal to increase the degrees of noise reduction in all the seats, and when it is determined that the vehicle is in manual driving, the correction unit corrects the noise reduction signal to increase the degrees of noise reduction in seats where passengers sit.

15. The electronic apparatus according to claim 13,
wherein the output unit includes speakers corresponding to the seats.

16. A noise reduction method in an electronic apparatus comprising an input unit configured to input an external sound signal inside a vehicle, a speech output unit configured to output sound into the vehicle, and a control unit, the method comprising:
inputting the external sound signal;
determining a driving state of the vehicle, wherein the driving state includes whether the vehicle is under the control of automatic driving or manual driving;
correcting a noise reduction signal depending on the determined driving state in order to reduce noise of the external sound signal; and
outputting the corrected noise reduction signal from the output unit.

17. The noise reduction method according to claim 16,
wherein the determining is to determine whether the vehicle is in automatic driving, and the correcting is to correct the noise reduction signal at a first degree as a relatively high degree of noise reduction when it is determined that the vehicle is in automatic driving, and to correct the noise reduction signal at a second degree as a relatively low degree of noise reduction when it is determined that the vehicle is not in automatic driving.

18. The noise reduction method according to claim 16,
wherein the correcting is to select a frequency band of a noise reduction signal to be generated or to correct an amplitude level of the noise reduction signal.

* * * * *